(12) United States Patent
Ho et al.

(10) Patent No.: US 6,242,936 B1
(45) Date of Patent: Jun. 5, 2001

(54) CIRCUIT FOR DRIVING CONDUCTIVE LINE AND TESTING CONDUCTIVE LINE FOR CURRENT LEAKAGE

(75) Inventors: Michael Duc Ho, Houston; Duy-Loan T. Le, Missouri City; Scott E. Smith, Sugar Land, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/366,232

(22) Filed: Aug. 3, 1999

Related U.S. Application Data
(60) Provisional application No. 60/096,035, filed on Aug. 11, 1998.

(51) Int. Cl.$^7$ .................................................. G01R 31/26
(52) U.S. Cl. .......................... 324/765; 365/182; 365/201
(58) Field of Search ....................... 324/765; 365/189.09, 365/226, 229, 230.06, 51, 63, 200, 182, 201; 327/143, 77, 390

(56) References Cited

U.S. PATENT DOCUMENTS

| | | | |
|---|---|---|---|
| 4,831,596 | * 5/1989 | Tran | 365/230.06 |
| 5,117,426 | * 5/1992 | McAdams | 371/214 |
| 5,345,422 | * 9/1994 | Redwine | 365/189.09 |
| 6,038,191 | * 3/2000 | Fukuhara et al. | 365/229 |

* cited by examiner

Primary Examiner—Safet Metjahic
Assistant Examiner—E. P. LeRoux
(74) Attorney, Agent, or Firm—Dwight N. Holmbo; Wade James Brady, III; Frederick J. Telecky, Jr.

(57) ABSTRACT

A circuit (100) that drives word lines and tests a word line (102) in a semiconductor device is disclosed. A charge circuit (108) couples a supply voltage (VPP) to a charge node (106) according to a potential at a boot node (110). The charge node (106) supplies a charge voltage for the word line (102). In a standard cycle, the boot node (110) is charged to a high voltage, and maintained at the high potential, to keep the word line (102) charged. In a test cycle, the boot node (110) is charged to a high voltage, and then discharged to a low voltage, thereby isolating the charge node (106) and the word line (102). In the event the word line (102) suffers from current leakage, a drop in potential will be detected at the charge rode (106).

22 Claims, 4 Drawing Sheets

CIRCUIT FOR DRIVING CONDUCTIVE LINE AND TESTING CONDUCTIVE LINE FOR CURRENT LEAKAGE

This application claims priority under 35 USC §119(e)(1) of provisional application number 60/096,035 filed Aug. 11, 1998.

TECHNICAL FIELD

The present invention relates generally to semiconductor integrated circuit devices, and more particularly to circuits for identifying defects that result in current leakage in such devices.

BACKGROUND OF THE INVENTION

Due to integrated circuit design and fabrication technologies, semiconductor integrated circuits continue to make generational improvements in operating speed, power consumption, and physical size. As just one example, each new generation of semiconductor memory devices has faster data access speeds, larger data storage capacity, and smaller overall physical sizes. Because most integrated circuit devices include a number of conductive layers that are separated from one another by insulating layers, one factor that has led to improvements in performance and size has been an increase in the number of conductive layers within the integrated circuit, as well as an increase in the density of the conductive lines that make up each conductive layer.

Unfortunately, despite the continuous advances in fabrication technology, there remain many uncontrollable factors in a semiconductor manufacturing process that can lead to product defects. Defects can arise from any of a number sources: very small particles, variation in starting materials, or lack of precision in a process step—such as an etching step, to name just a few. Due to the high density of conductive lines within highly integrated circuits devices, defects can lead to short circuit conditions (shorts) between adjacent conductive lines. Such shorts can be horizontal, undesirably connecting two conductive lines of the same conductive layer, or vertical, undesirably connecting lines from two different conductive layers.

Defects arising from manufacturing can be overcome by "repairing" an IC through the use of redundant circuits. A redundant circuit provides identical functionality to "standard" circuits in an IC. In the event a standard circuit is not operational due to a short, the standard circuit can be disabled, and replaced by a redundant circuit. In many types of semiconductor devices, the implementation of redundant circuits occurs at a manufacturing step referred to as "wafer probe."

Wafer probe is performed while integrated circuit devices are one portion of a contiguous finished semiconductor wafer. The finished wafer is subsequently sliced into a number of individual die, each of which consists of a single integrated circuit device. During wafer probe, electrical probes are dropped onto individual devices to test the operation of the device. If a defect is located, it can be repaired via a "laser repair" step. During laser repair, a laser will evaporate a predetermined set of laser fusible links, and thereby replace a defective circuit with a redundant circuit. Each individual die will then be packaged by subsequent manufacturing steps.

While wafer probe and laser repair can increase yields by compensating for some manufacturing defects, there are still some defects that can be missed at wafer probe and result in defective devices. One type of defect that can escape detection at a conventional wafer probe step is a short circuit condition that initially draws only small amounts of current (a "slow leaker"). Such shorts can arise from very small holes in an insulating layer ("pin holes") or very thin residual conductive filaments resulting from an inadequate etch step ("stringers"). Such defects, while drawing only a small amount of current at first, can degrade over time, drawing more current, eventually resulting in a failing device.

Certain reliability screening tests can catch pin hole and stringer defects. For example, integrated circuit devices are often subjected to a "burn-in" step or operational life ("op life") step. Burn-in and op life steps exercise the functions of a device (sometimes under elevated temperatures and/or voltages) so as to induce failures. Burn-in and op life can screen out defective devices. Unfortunately, burn-in and op life are conducted on "finished" (i.e., fully packaged) devices. Finished devices, because they are covered by a package (such as an epoxy resin), cannot be repaired with a laser repair step. Thus, those defective devices identified at burn-in or op life must be scrapped.

It would be desirable to find some way of detecting slow leaker defects prior to an integrated circuit device being packaged. If detection of these types of defects were possible, devices that would otherwise be scrapped could be repaired, enhancing yield in a manufacturing process.

SUMMARY OF THE INVENTION

According to the preferred embodiment, a circuit is provided for driving a word line to select the word line. In addition, the circuit allows the word line to be tested for defects that result in relatively small amounts of current leakage. In a test operation, the preferred embodiment charges a word line and then electrically isolates the word line. The potential of the word line can then be monitored to determine if the word line suffers from current leakage. In the event there is current leakage from the word line, the potential will fall. If the word line does not suffer from current leakage, the potential will remain essentially the same.

In the preferred embodiment, the word line is selected by activating a charge circuit that includes an n-channel insulated gate field effect transistor (IGFET). The charge circuit couples a high voltage to a charge node, and the charge node is coupled to a word line. The operation of the charge circuit is controlled by the potential at a boot node. To prevent a threshold voltage drop caused by the n-channel IGFETs of the charge circuit, the charge circuit is enabled by driving the boot node to a boosted voltage. In a standard (non-test) cycle, the boot node is maintained at the boosted voltage, keeping the word line charged. In a test cycle, once the word line is charged, the boot node is discharged, thereby disabling the charge circuit and isolating the word line. The potential of the charge node can then be monitored to detect leakage.

According to one aspect of the preferred embodiment, a probe pad is coupled to the charge node, allowing the semiconductor memory device to be tested in wafer form.

According to another aspect of the preferred embodiment, the semiconductor memory device is a dynamic random access memory (DRAM), and the boot node is discharged in response to a sense amplifier enable signal.

An advantage of the preferred embodiment is that it can detect defects that result in slow current leakage.

Another advantage of the preferred embodiment is that semiconductor memory device can be tested in the wafer form, allowing defects to be repaired prior the device being packaged.

DETAILED DESCRIPTION OF THE EMBODIMENTS

The preferred embodiment includes a circuit and method for testing a conductive line for defects that result in relatively small amounts of current leakage. The preferred embodiment charges a conductive line to a predetermined potential, and then isolates the line. The line is connected to a probe pad that can be probed to monitor the voltage of the tested line. Variations in the voltage of the tested line indicate current leakage. By detecting the leakage by a probing step, an integrated circuit device can be repaired prior to being packaged.

The preferred embodiment may be used in a semiconductor memory device to test word lines for defect induced current leakage, and can be readily implemented in word line charge circuits by utilizing existing current structures to execute the test operation.

Figure 1:
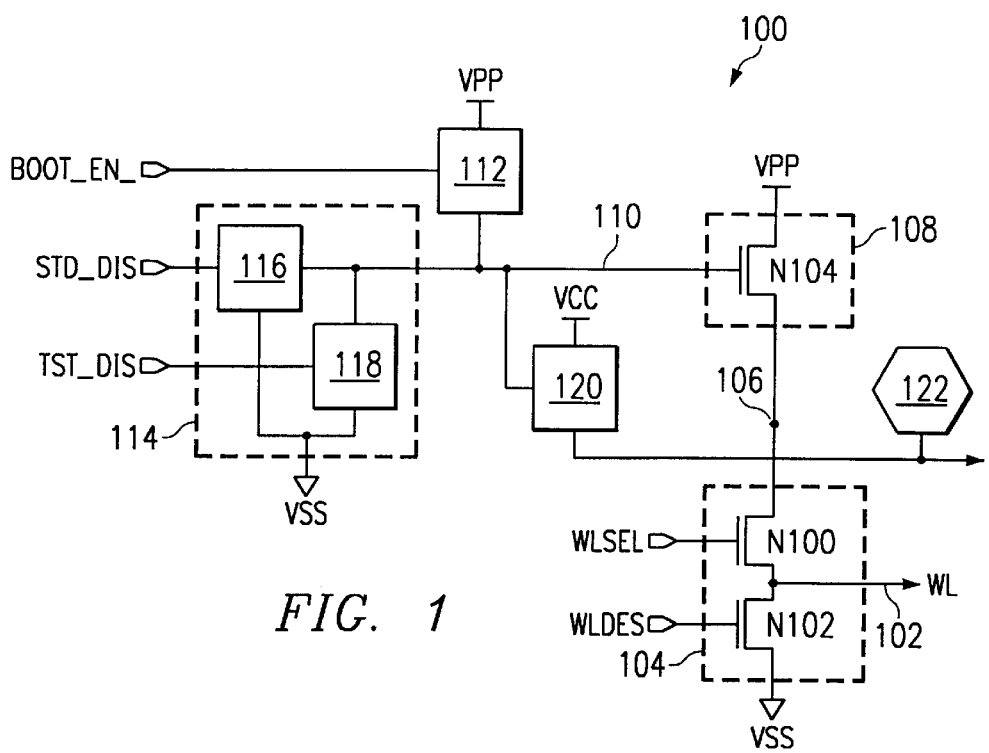
FIG. 1 is a block schematic diagram of a preferred embodiment.

The preferred embodiment is a word line drive and test circuit, and is set forth in a block schematic diagram in FIG. 1. The preferred embodiment is designated by the general reference character 100, and is shown to include a word line 102 and an associated a word line driver 104. The word line driver 104 receives a word line select signal WSEL and a word line de-select signal WLDES. The WSEL signal is decoded, in that it is activated in response to an applied address. When the WLSEL signal is active, the word line 102 is selected, and will be coupled to a charge node 106. When the WLDES signal is active, the word line 102 is de-selected, and will be coupled to a low power supply voltage VSS. In the particular arrangement of FIG. 1, the word line driver 104 includes two n-channel metal-oxide-semiconductor (MOS) transistors (N100 and N102) having source-drain paths arranged in series between the charge node 106 and a low power supply voltage VSS.

The charge node 106 is coupled to a pumped voltage supply VPP by a charge circuit 108. The VPP voltage may be generated by charge pump circuits or like, and is greater than the high power supply voltage VCC. The charge circuit 108 is enabled and disabled according to the potential at a boot node 110. When enabled, the charge circuit 108 couples the charge node 106 to the VPP voltage. When disabled, the charge circuit 108 isolates the charge node 106 from the VPP voltage. In the embodiment of FIG. 1, the charge circuit 108 is shown to include an n-channel MOS transistor N104 having a source-drain path coupled between the VPP supply and the charge node 106. The gate source capacitance of transistor N104 is coupled to the boot node 110.

The potential at the boot node 110 is established by a boot circuit 112 and a boot disable circuit 114. An enabling potential (high in the arrangement of FIG. 1) is established by the boot circuit 112 and a disabling potential (low in the arrangement of FIG. 1) is established by the disable circuit 114. In FIG. 1, in order to eliminate any threshold voltage drop when transistor N104 is turned on, the enabling potential is a "booted" potential. That is, the boot node 110 is driven by the boot circuit 112 to a potential that is greater than the VPP voltage. In this way, when the booted voltage is applied to the boot node 110, transistor N104 will apply the full VPP voltage to the charge node 106. The word line driver 104 can then drive the word line 102 high with the VPP voltage from the charge node 106. The boot circuit 112 is controlled by a boot enable signal, shown as BOOT_EN_. When the BOOT_EN_ signal transitions low, the boot node 110 is driven to the booted voltage.

The disable potential of the arrangement of FIG. 1 is a low power supply voltage VSS. The disable circuit 114 applies the disable potential to the boot node 110 in response to two signals, a standard disable signal STD_DIS and a test disable signal TST_DIS. When either of the STD_DIS or TST_DIS signals is active (at a high voltage in the arrangement of FIG. 1) the boot node 110 will be driven to VSS, thereby disabling the charge circuit 108. In the embodiment of FIG. 1, the disable circuit 114 includes a standard disable section 116 that is enabled by the STD_DIS signal, and a test disable section 118 that is enabled by the TST_DIS signal.

The embodiment of FIG. 1 also includes a clamp circuit 120 that is coupled to the charge node 106 and controlled by the potential at the boot node 110. Provided the potential at the boot node 110 is high, the clamp circuit 120 will prevent the charge node 106 from falling below a clamp voltage. However, in the event the boot node 110 is discharged by the activation of either the STD_DIS or TST_DIS signal, the clamping action of the clamp circuit 120 will be disabled. Because the TST_DIS signal drives the boot node 110 low, and the low boot node 110 disables the clamp circuit 120, the clamp circuit 120 can also be conceptualized as being disabled by the TST_DIS signal.

Also set forth in FIG. 1 is a probe pad 122. The probe pad 122 potential is monitored in a test cycle to determine whether or not current leakage exists on a tested word line. It is understood that while only one word line driver 104 is connected to the charge node 106, the charge node 106 is shown to extend further to the right in FIG. 1. This is intended to indicate that the charge node 106 is shared by other word line drivers that are enabled by other decoded word line enable signals. In such an arrangement, the other word lines may be tested by monitoring the potential at the charge node 106.

Figure 2A:
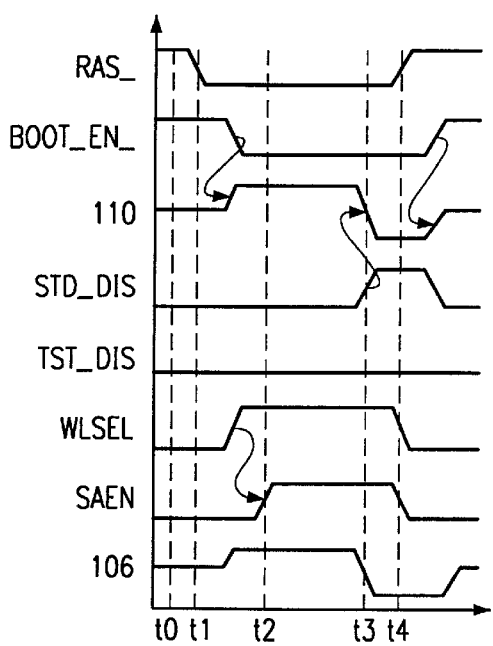
FIG. 2A is a timing diagram illustrating the operation of the preferred embodiment in a standard cycle.
Figure 2B:
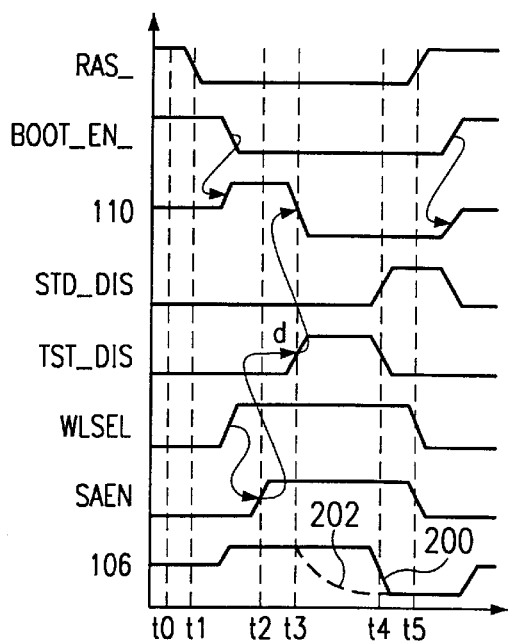
FIG. 2B is a timing diagram illustrating the operation of the preferred embodiment in a test cycle.

The general operation of the embodiment of FIG. 1 is best understood with reference to FIGS. 2A and 2B. FIG. 2A is a timing diagram illustrating a standard operating cycle. The standard operating cycle may be used to access memory cells in a standard memory device function such as a read or write operation. In addition, the standard operation may be used in a test mode that drives word lines to a high potential, but that is not concerned with detecting slow leakage on the word lines. In the standard cycle of FIG. 2A it is assumed that the circuit of FIG. 1 is utilized in a dynamic random access memory (DRAM). Therefore, the standard cycle is initiated by the common DRAM timing signal—the row address strobe (RAS_) signal. In addition to the RAS_ signal, the BOOT_EN_ signal, STD_DIS signal, TST_DIS signal, and WLEN signals are also set forth.

FIGS. 2A and 2B also illustrate the potential of the boot node 110, shown as waveform "110," and the potential at the charge node 106, shown as waveform "106." The timing diagram also includes a sense amplifier enable signal SAEN. The SAEN signal is a timing signal that will enable sense amplifiers within the DRAM following the activation of a word line.

Referring now to FIG. 2A in conjunction with FIG. 1, a standard cycle operation will be described. At time t0, the RAS_ signal and BOOT_EN_ signal are high. The boot node 110 has been previously charged to Vcc−Vtn, but has not yet been driven to the boot (>VPP) potential. The STD_DIS signal is low, disabling the standard disable section 116 and allowing the boot node 110 to be maintained at a high voltage. The TST_DIS signal is also low, and because a standard cycle is illustrated in FIG. 2A, the TST_DIS signal will remain low throughout the illustrated cycle, keeping the test disable section 118 disabled. The WLSEL signal is low, turning off transistor N100 within the word lines driver 104, isolating the word line 102 from the charge node 106. The SAEN signal is also low. The high boot node 110 potential enables the clamping circuit 120. The charge node 106, like the boot node 110, has been previously charged to a high voltage.

At time t1, the RAS_ signal transitions low, beginning an active standard cycle. In response to the RAS_ transition, the BOOT_EN_ signal transitions low, activating the boot circuit 112, which drives the boot node 110 to the boot potential. With the boot node 110 at the boot potential, the charge circuit 108 is enabled and the charge node 106 is coupled to the VPP potential, without a threshold voltage drop. The WLSEL signal is also driven in response to the RAS_ signal after decoding, and couples with the charge node 106 to drive the word line 102. Thus, when the charge node 106 is driven to the VPP potential, with the WLSEL signal high, the word line 102 will be driven high.

At time t2, following the RAS_ and WLSEL transitions, the second booting SAEN signal is driven high. Sense amplifiers within the memory device are activated, and in the event the standard cycle is a read operation, data signals will be amplified by the sense amplifiers and output from the DRAM.

At time t3, a given time period after the BOOT_EN_ signal goes low, the STD_DIS signal goes high. The standard disable section 116 is activated, and the boot node 110 is discharged to the VSS voltage, disabling the charge circuit 108. The charge node 106 is thus isolated from the word line driver 104.

At time t4, the RAS_ signal returns high, terminating the active standard cycle. In response to the termination of the cycle, the BOOT_EN_ signal returns high. The STD_DIS signal also goes low, disabling the standard disable section 116, and allowing the boot node 110 to be precharged. The termination of the active standard cycle also causes the WLSEL signal to return low, turning off transistor N100, isolating the word line 102 from the charge node 106. The WLDES signal will then go high, discharging the word line 102. The SAEN signal also goes low, turning off sense transistors within the DRAM.

FIG. 2B is a timing diagram illustrating a test cycle. The timing diagram of FIG. 2B includes the same waveforms as FIG. 2A. The response of FIG. 2B differs from that of FIG. 2A in that the TST DIS signal is activated during the test cycle.

Referring now to FIG. 2B in conjunction with FIG. 1, the test cycle starts out in a similar fashion to the standard cycle. From time t0 to t2, the response of the various waveforms is same as that of FIG. 2A. The test cycle differs from standard cycle in that the TST_DIS signal is activated some time after the BOOT_EN_ signal is activated, resulting in the boot node 110 being discharged while the charge node 106 remains at the VPP voltage. Thus, as shown in FIG. 2B, at time t3 the TST_DIS signal goes high.

In the particular arrangement of FIG. 1, the TST_DIS signal is generated from the rising edge of the SAEN signal, and is delayed to guarantee the word line will obtain the correct level. As the SAEN signal goes high, the test disable section 118 is enabled and the boot node 110 is coupled to the VSS voltage. Transistor N104 is turned off, isolating the charge node 106 from the VPP voltage. With the boot node 110 at the VSS voltage, the clamp circuit 118 is also disabled. At the same time, the WLSEL signal remains high, and transistor N100 remains on, driving the word line 102 to the charge node 106. In this arrangement, provided there is no leakage on the word line 102, the charge node 106 will remain at about the VPP voltage. However, if the word line 102 is defective, resulting in some current leakage from the word line, the potential at the charge node 106 will begin to fall. This is represented by the response of node 106 in FIG. 2B. The node 106 response includes two waveforms shown as 200 and 202. Waveform 200 illustrates the response of a "good" (no leakage) word line. Waveform 202 illustrates the response of a "bad" (leaking) word line. The good word line waveform 200 remains at the VPP level. The bad word line waveform 202 begins to fall once the boot node 110 is discharged. In this manner, by monitoring the potential at the charge node 106, a leaking word line can be detected.

The test cycle continues in a similar fashion to the standard cycle. Thus, the response of times t4 and t5 in FIG. 2B follows that of times t3 and t4 in FIG. 2A.

Figure 3:
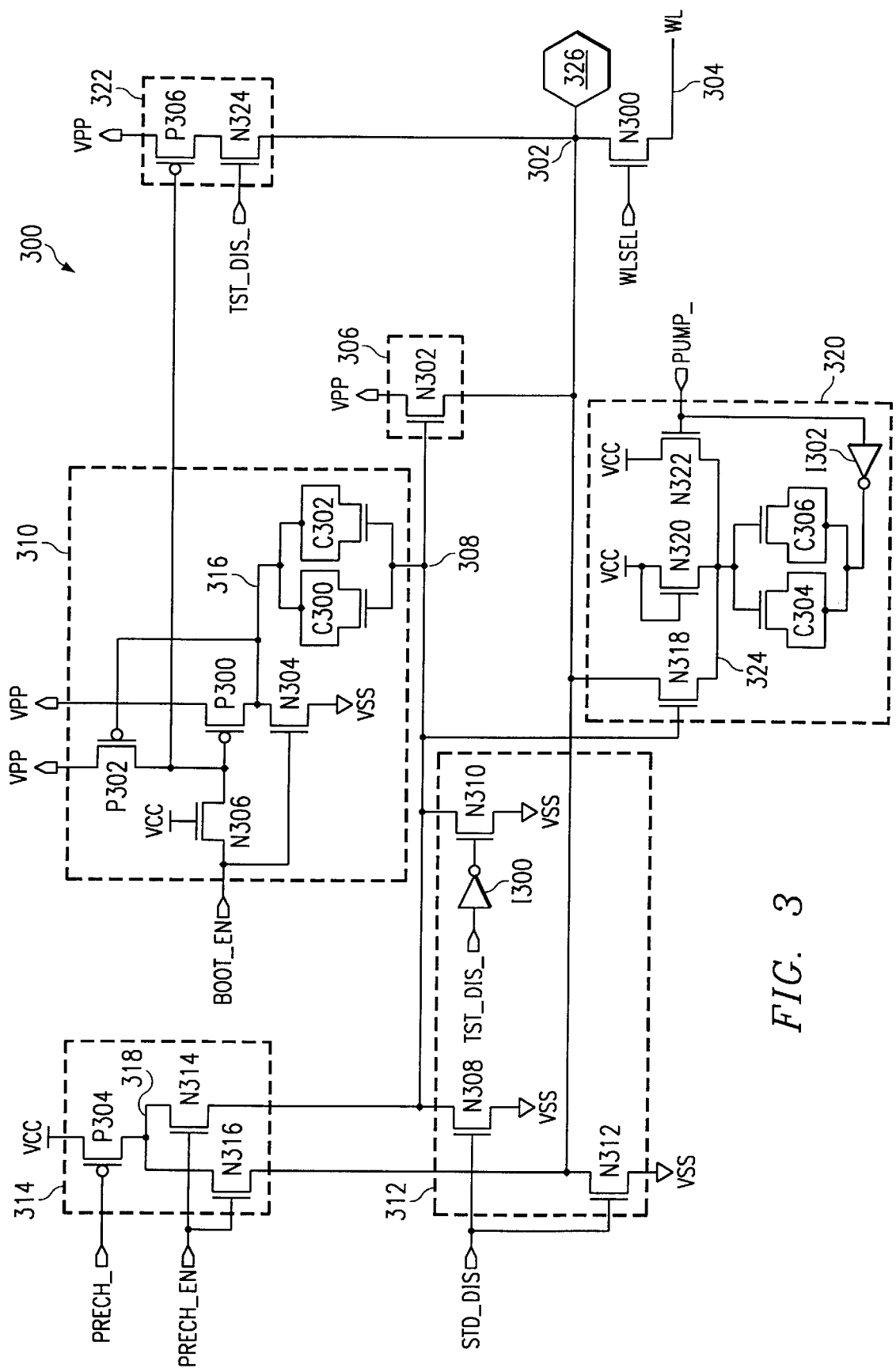
FIG. 3 is a schematic diagram illustrating a word line drive and test circuit of the preferred embodiment.

Referring now to FIG. 3, a detailed schematic diagram of the preferred embodiment is set forth. The preferred embodiment is a word line drive and test circuit that operates in conjunction with a high power supply voltage VCC, a low power supply voltage VSS, and a "pumped" supply voltage VPP. The VPP voltage may be generated by charge pump circuits or the like, and is greater than the VCC voltage. The preferred embodiment is designated by the general reference character 300, and is show to include a charge node 302 that is coupled to a word line 304 by an n-channel metal-oxide-semiconductor (MOS) transistor N300. The charge node 302 is coupled to the VPP voltage by a charge circuit 306. The charge circuit 306 of the preferred embodiment is shown to include an n-channel MOS charge transistor N302, having a source-drain path coupled between the VPP voltage and the charge node 302. The gate of transistor N302 is coupled to a boot node 308, thus the operation of the charge circuit 306 is controlled by the potential at the boot node 308.

The potential at the boot node 308 is controlled by a boot circuit 310, a disable circuit 312, and a first precharge circuit 314. The boot circuit 310 is a charge pump circuit that drives the boot node 308 to a boot voltage that is greater than the VPP voltage. By driving the boot node 308 to the boot voltage, a full VPP voltage level can be applied to the charge node 302 without a threshold voltage drop. The boot circuit 310 receives a boot enable signal BOOT_EN_, and executes the pump function in response to a high-to-low transition in a BOOT_EN_ signal.

The boot circuit 310 is shown to include a level shifter having p-channel MOS transistor P300 and an n-channel MOS transistor N304. Transistors P300 and N304 have source-drain paths arranged in series between the VPP voltage and the VSS voltage. The common drains of transistors P300 and N304 drive a boot precharge node 316. In the particular arrangement of FIG. 3, the gate of transistor N304 is driven directly by the BOOT_EN_ signal. The gate of transistor P300 is driven by the BOOT_EN_ signal by way of the source-drain path of a transfer transistor N306. The gate of clamp transistor N306 is coupled to the VCC voltage. The pump action of the boot circuit is further accomplished by a boot capacitance situated between the boot precharge node 316 and the boot node 308. The boot capacitance of the circuit of FIG. 3 is shown to include two MOS capacitors, C300 and C302.

In operation, the precharge action of the boot circuit 310 begins with the boot node 308 being coupled to a precharge voltage while the BOOT_EN_ signal is high. With the BOOT_EN_ signal high, transistor N304 is turned on, coupling the boot precharge node 316 to VSS. The low precharge node 316 potential turns on transistor P302, which couples the gate of transistor P300 to the VPP voltage, ensuring that transistor P300 is turned off. If it is assumed that the boot node 308 is at a positive precharge potential, with the boot precharge node 316 at the VSS voltage, capacitors C300 and C302 will be charged to a boot precharge voltage.

The boot circuit 310 pump action occurs when the BOOT_EN_ signal goes low.

Transistor N304 is turned off, while transistor P300 is turned on. The boot precharge node 316 is driven to the VPP voltage, turning off transistor P302. At the same time, because capacitors C300 and C302 were previously charged with a precharge potential, the boot node 308 will be driven above the precharge potential to the boot potential.

The disable circuit 312 discharges the boot node 308 to the VSS voltage, to thereby disable the charge circuit 306. The disable circuit 312 receives a standard disable signal STD_DIS and a test disable signal TST_DIS_. When the STD_DIS signal is high or the TST_DIS_ is low, the boot node 308 will be discharged to the VSS voltage. In the embodiment of FIG. 3, to accomplish a standard disable operation, the disable circuit 312 includes an n-channel MOS standard disable transistor N308 having a source-drain path coupled between the boot node 308 and the VSS voltage. The gate of transistor N308 receives the STD_DIS signal. To accomplish a test disable operation, the disable circuit 312 includes a disable inverter I300 that receives the TST_DIS_ signal, and an n-channel MOS test disable transistor N310 having a gate coupled to the output of inverter I300. The source-drain path of the test disable transistor N310 is coupled between the boot node 308 and the VSS voltage. In the particular arrangement of FIG. 3, the disable circuit 312 further includes a charge node disable transistor N312 having a source-drain path situated between the charge node 302 and the VSS voltage. The gate of transistor N312 is also driven by the STD_DIS signal.

The first precharge circuit 314 serves to establish the precharge voltage on the boot node 308. In addition, in the particular arrangement of FIG. 3, the first precharge circuit 314 also precharges the charge node 302. The first precharge circuit 314 is shown to include a p-channel MOS precharge transistor P304 having a source-drain path arranged between the VCC voltage and a precharge supply node 318. The gate of transistor P304 is driven by a precharge signal PRECH_. The precharge supply node 318 is connected to the boot node 308 by the source-drain path of a first n-channel MOS precharge transistor N314. In a similar fashion, the precharge supply node 318 is connected to the charge node 302 by the source-drain path of a second n-channel MOS precharge transistor N316. The gates of transistors N314 and N316 are driven by a precharge enable signal PRECH_EN.

In operation, at the conclusion of a test cycle, with the PRECH_EN signal low, the PRECH_ signal will go low. The precharge supply node 318 is coupled to the VCC voltage. Subsequently, the PRECH_EN signal will go high, thereby turning on transistors N314 and N316, and pulling the boot node 308 and the charge node 302 to a precharge voltage of VCC−Vtn. The PRECH_ signal will then go high, turning off transistor P304, allowing the boot node 308 and charge node 302 to be driven to higher potentials in an active portion of a test cycle.

In addition to being charged to the VPP voltage by the charge circuit 306, the potential at the charge node 302 is further affected by a clamp/slow frequency pump circuit 320 (to hold WL constant from leakage in a long RAS-) and a second precharge circuit 322. The clamp/pump circuit 320 serves to clamp the charge node 302 to a clamp voltage and to thereby prevent the charge node 302 from falling below a predetermined voltage level. In addition, the clamp/pump circuit 320 will boost the voltage of the charge node 302 prior to the active portion of a test cycle. The clamp/pump circuit 320 of FIG. 3 is shown to include an n-channel MOS clamp enable transistor N318. The source-drain path of transistor N318 couples the charge node 302 to a clamp node 324. The gate of transistor N318 is coupled to the boot node 308. The clamp node 324 is further coupled to the VCC voltage by the source-drain path of an n-channel MOS clamping transistor N320. Transistor N320 has a "diode" configuration with its gate being coupled to its drain. In this arrangement, provided transistor N318 is turned on, in the event the potential at the charge node 302 falls lower than VCC−Vtn, transistor N320 will turn on, and clamp the charge node 302 at the VCC−Vtn potential.

The pump action of the charge/pump circuit 320 is accomplished by an n-channel MOS pump transistor N322, a pump inverter I302, and a pair of capacitors C304 and C306. Like transistors N318 and N320, transistor N322 has a source-drain path situated between the VCC voltage and the clamp node 324. The gate of transistor N322 receives a slow oscillator pump signal PUMP_. Inverter I302 also receives the PUMP_ signal as an input. The capacitors C304 and C306 are arranged in parallel between the clamp node 324 and the output of inverter I302.

The operation of the clamp/pump circuit 320 begins with the PUMP_ signal being high. Transistor N322 is turned on, and drives the output of inverter I302 to the VSS voltage. In this arrangement, capacitors and C304 and C306 are charged by way of transistor N322 and N320. At the start of the active portion of the test cycle, the PUMP_ signal will go low, turning off transistor N322, and driving the output of inverter I302 to the VCC voltage. With the output of inverter I302 high, the previous charge established on capacitor C304 and C306 results in the clamp node 324 being boosted in potential. Provided transistor N318 is turned on, the charge node 302 will be prevented from falling more than one Vtn below the boosted clamp node 322 potential.

The circuit 322 of FIG. 3 is shown to include a p-channel MOS precharge transistor P306 and an n-channel MOS passgate transistor N324. Transistors P306 and N324 have source-drain paths arranged in series between the VPP voltage and the charge node 302. The gate of transistor P306 is driven by the BOOT_EN_ signal by way of transistor N306 within the boot circuit 310. The gate of transistor N324 is coupled to the TST_DIS_ signal. At the start of an active test cycle, the TST_DIS_ signal will be high and BOOT_EN_ signal will be low. Thus, the second precharge circuit 322 and will help charge the charge node 302. However, later on in the active test cycle, the TST_DIS_ signal will go low, turning off transistor N324, and isolating the charge node 302 from transistor P306.

The embodiment of FIG. 3 further includes a probe pad 326 connected to the charge node 302. In the preferred embodiment, the probe pad 326 is a relatively large metallization structure that can be physically probed by a test device. Thus, integrated circuits utilizing the preferred embodiment, can have the charge node 302 potential monitored during a test cycle to determine if the tested word line 304 suffers from current leakage. If leakage is detected, redundancy circuits can be enabled by vaporizing fusible links with a laser, to replace the defective word line 304.

Figure 4:
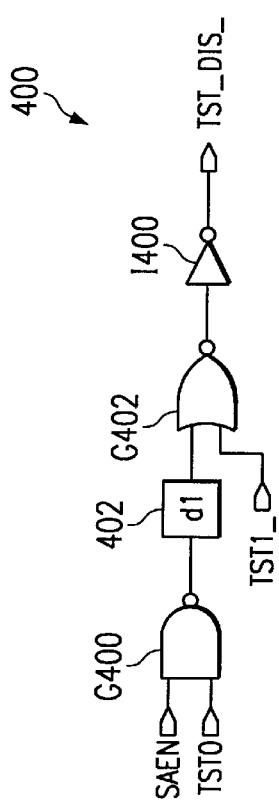
FIG. 4 is a schematic diagram illustrating a test timing circuit that may be used in the preferred embodiment.

Referring now to FIG. 4, a test timing circuit is set forth in a schematic diagram. The test timing circuit receives a sense amplifier enable signal SAEN and two test mode signals, shown as TST0 and TST1. In response to the SAEN, TST0 and TST1 signals, the test timing circuit provides the TST_DIS_ signal. The TST_DIS_ signal is initially inactive (high) at the start of an active test cycle. After a given delay, the TST_DIS_ signal is activated (driven low).

In the particular arrangement of FIG. 4, the test timing circuit is designated by the general reference character 400, and is shown to include a two-input NAND gate G400 that receives the SAEN signal as one input and the TST0 signal as the other input. The output of gate G400 passes through a delay circuit 402. The output of the delay circuit 402 is provided as one input to a two-input NOR gate G402. The other input of gate G402 is the TST1_ signal. The output of gate G402 is inverted by inverter I400 to generate the TST_DIS_ signal. In the preferred embodiment, the SAEN signal is the "latest" sense amplifier enable signal in the memory device. That is, of all the sense amplifier enable signals within a memory device, the SAEN signal is the most delayed with respect to the main timing signal of the memory device. In the particular arrangement of FIGS. 3, 4 and 5, the memory device is a DRAM, and so the SAEN signal is timed off of a RAS_ signal. This, in combination with the delay circuit 402, ensures that a tested word line will be sufficiently charged before it is isolated and tested for leakage.

In operation, prior to an active cycle the SAEN signal will be low. In a test operation, the TST0 signal is high and the TST1_ signal is low. Thus, the output of gate G400 will be high. With a high and low input applied to gate G402, the output of gate G402 will be low, resulting in a high TST_DIS_ signal. Following the start of an active cycle, the SAEN signal will be driven high. The SAEN transition results in the output of gate G400 being driven low. The low G400 output is delayed by the delay circuit 402 and then applied to gate G402 Once both inputs to gate G402 are low, the output of gate G402 will be driven high. Inverter I400 will then activate the TST_DIS_ signal, by driving it low.

Figure 5:
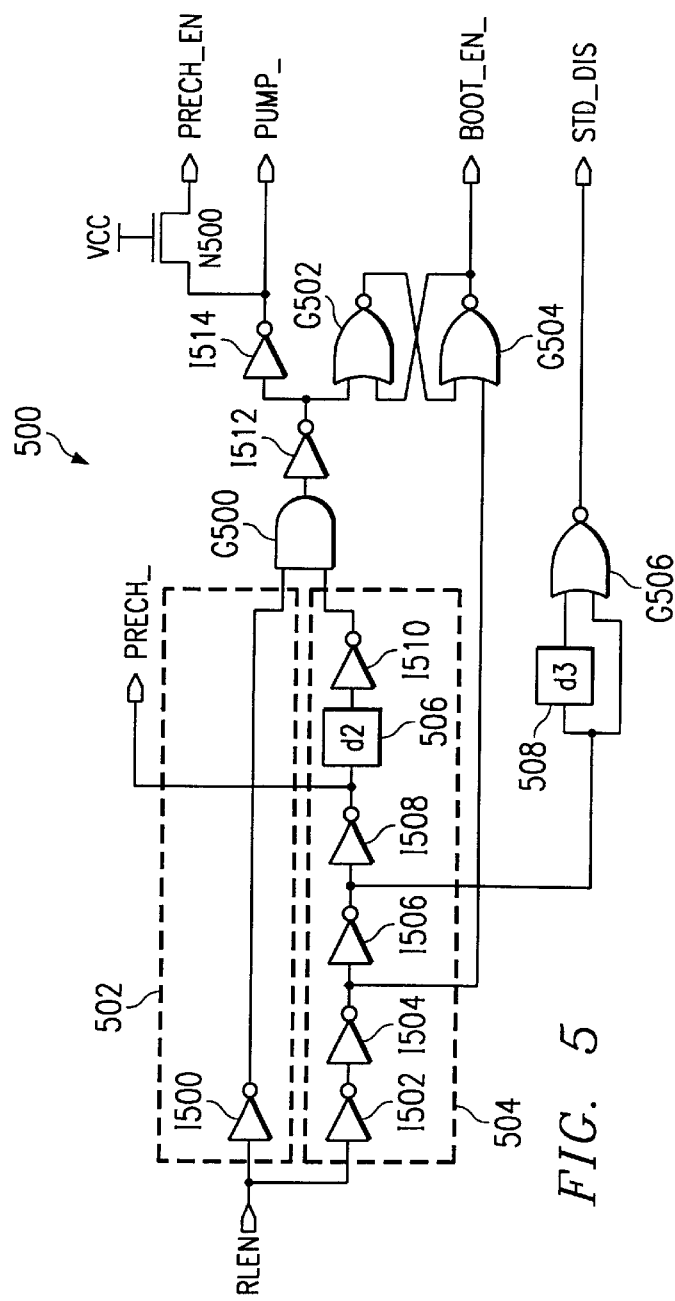
FIG. 5 is a schematic diagram illustrating a standard timing circuit that may be used in the preferred embodiment.

Referring now to FIG. 5, a standard timing circuit is set forth in a schematic diagram. The standard timing circuit receives a row logic enable signal RLEN that is initiated in response to an active cycle (a low RAS_ transition in the case of a DRAM). In response to the RLEN signal, the standard timing circuit provides the PRECH_, PRECH_EN, PUMP, BOOT_EN_ and STD_DIS timing signals. The standard timing circuit is designated by the general reference character 500 and includes a first timing path 502 and a second timing path 504. The first timing path 502 receives the RLEN signal and applies it as one input to a two-input NAND gate G500. The first timing path 502 includes an inverter I500. The second timing path 504 also receives the RLEN signal and applies it as the second input to gate G500. The second timing path 504 includes five inverters I502, I504, I506, I508 and I510 arranged in series, with a precharge delay circuit 506 situated between inverters I508 and I510. The output of gate G500 is inverted by another inverter I512. The output of inverter I512 is inverted once again by inverter I514 to generate the PUMP_ signal. The PUMP_ signal is passed through an n-channel MOS clamping transistor N500 to generate the PRECH_EN signal.

The output of inverter I512 is also provided as one input to a pair of cross-coupled NOR gates G502 and G504. The other input to the cross-coupled gate pair (G502 and G504) is provided by inverter I504 within the second timing path 504. The output of gate G504 is the BOOT_EN_ signal.

The STD_DIS signal is generated by coupling the output of inverter I506 of the second timing path 504 to both inputs of a two-input NOR gate G506. The output of inverter I506 is coupled directly to one input of gate G506, and to the other input by way of disable delay circuit 508.

Figure 6:
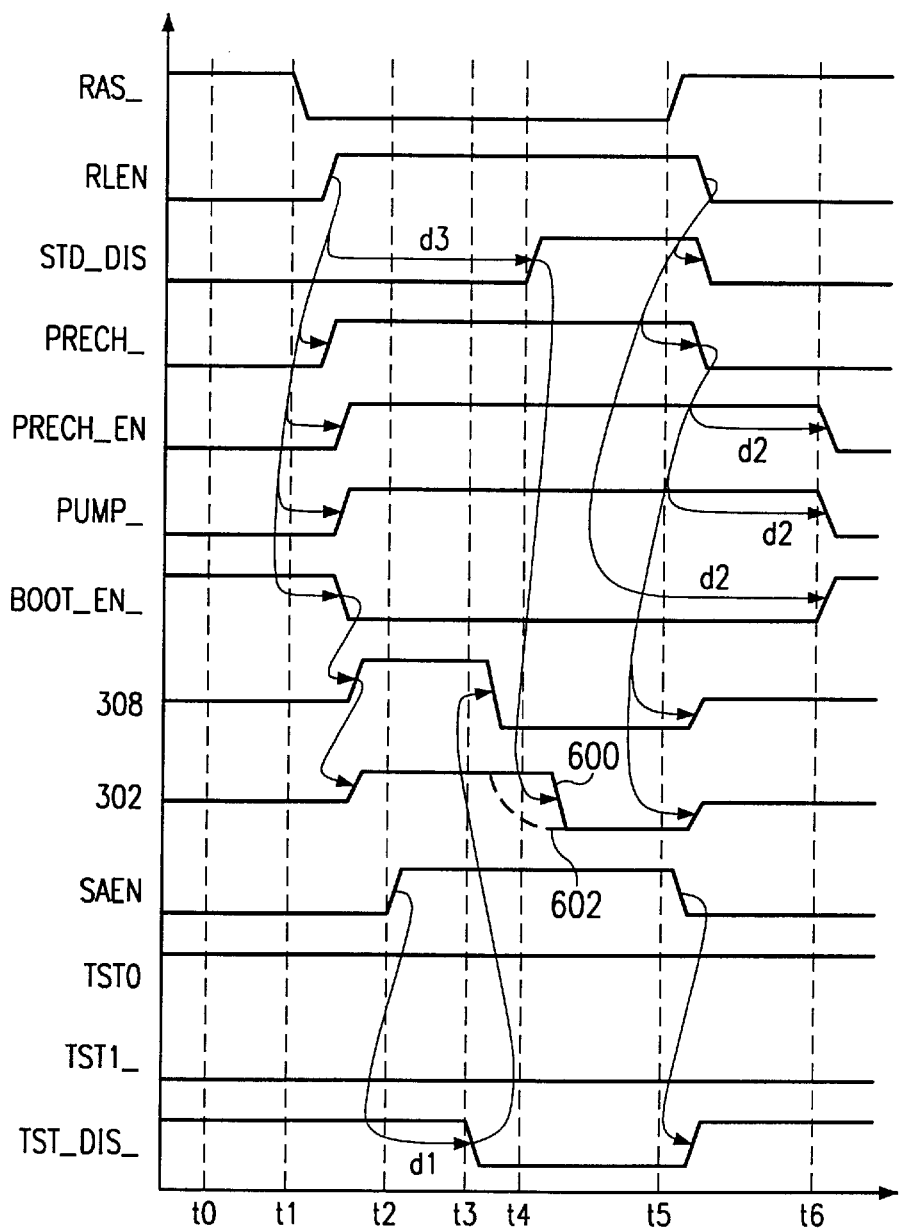
FIG. 6 is a timing diagram illustrating the operation of the embodiment set forth in FIGS. 3, 4 and 5.

The operation of the embodiment set forth in FIGS. 3, 4 and 5 is best understood with reference to FIG. 6. FIG. 6 is a timing diagram setting forth the timing signals received by, and provided from, the test timing circuit 400 and the standard timing circuit 500. In addition, the response of the boot node 308, shown as waveform "308," and the response of the charge node 302, shown as waveform "302," are also included in the timing diagram. FIG. 6 illustrates a test cycle by which the charge node 308 of the word line drive and test circuit 300 is initially charged, isolated, and then monitored for leakage.

Referring now to FIG. 3 in conjunction with FIG. 6, the operation of the embodiment set forth in FIGS. 3 to 5 will be described. At time t0, the RAS_ signal is high, placing the circuit 300 in the inactive state. With RAS_ high, the RLEN signal is inactive (low). The low RLEN signal applied to the standard timing circuit 400 results in the STD_DIS, PRECH_ and PRECH_EN all being low. The low STD_DIS signal turns off transistor N308 and N312 within the disable circuit 312. While the PRECH_EN signal results in the precharge supply node 318 being charged to the VCC voltage, the low PRECH_EN signal turns off transistors N316 and N314 within the first precharge circuit 314, isolating the boot node 308 and charge node 302 from the precharge supply node 318. The low PUMP_ signal indicates that a pump operation has taken place within clamp/pump circuit 320 contributing to a precharge operation, which raises the potential at the charge node 302.

At the same time, the BOOT_EN_ signal is low, indicating that the boot circuit 310 has charged its capacitors C300 and C302 in preparation for a boot operation. The boot node 308 has been previously precharged by operation of the first precharge circuit 314 and clamp/pump circuit 320, and is therefore at a precharge voltage. Likewise, the charge node 302 has previously been precharged. The high BOOT_EN_ signal is further applied to the gate of transistor P306 within the second precharge circuit 322, thereby disabling the second precharge circuit 322.

Also at time t0, when the RAS_ signal is high, the SAEN signal is low. The TST0 signal is high and the TST1_ signal is low, indicating a word line leakage test mode has been entered. The particular use of two test signals (TST0 and TST1) to enter the leakage test mode is done to reduce the number input signals required to induce particular test modes. The SAEN, TST0 and TST1_ signal values result in high TST_DIS_ signal. The high TST_DIS_ signal turns off transistor N310 within the disable circuit 312 and turns on transistor N324 within the second precharge circuit 322.

At time t1, the RAS_ cycle transitions low, beginning the active portion of the test cycle. The falling RAS_ signal drives the RLEN signal high. Within the standard timing circuit 500, the PRECH_, PRECH_EN and PUMP_ signals are all driven high. The high PRECH_ and PRECH_ EN signals turn off transistor P304, and turn on transistors N314 and N316 within the first precharge circuit 314. The high PUMP_ signal results in the clamp/pump circuit 320 preparing to charge the capacitors C304 and C306.

In response to the high-to-low transition in the RAS_ signal, the BOOT_EN_ signal is driven low, initiating the boot operation of boot circuit 310. The boot node 308 is driven to the high boot voltage, enabling the charge circuit 306, and pulling the charge node 302 to the VPP voltage.

In response to the high-to-low RAS_ transition, the SAEN signal goes high at time t2. Following a delay for WL to reach the correct level that is established by the delay circuit 402 within the test timing circuit 400, the TST_ DIS_ signal will transition low at time t3. The low TST_ DIS_ signal turns off transistor N324 within the second precharge circuit 322, and then turns on transistor N310 within the disable circuit 312. When transistor N310 turns on, the boot node 308 is discharged to the VSS voltage, disabling the charge circuit 306. Following the discharge of the boot node 308 the charge node 302 will be isolated from charging and discharging devices, and can thus be monitored at the probe pad 326 for the presence of leakage current. Two responses for the charge node 302 are set forth in FIG. 6. A solid line response shown as 600 represents a "no leakage" response. A dashed line response shown as 602 represents a leaking response. The discharge of the boot node 308 also causes transistor N318 within the clamp/pump circuit 320 to turn off, isolating the clamp node 324 from the charge node 302.

At time t4, the initial low-to-high RLEN transition propagates through the disable delay circuit 508 (in the standard timing circuit 500) to cause the STD_DIS signal to transition high. The high STD_DIS signal turns on transistors N308 and N312 within the disable circuit 312. Because transistor N312 has already discharged the boot node 302, the turning on of transistor N308 does not affect the potential at the boot node 302. The turning on of transistor N312 discharges the charge node 302 to the VSS voltage.

At about time t5, the SAEN signal returns low and the RAS_ signal returns high, terminating the active portion of the test cycle. The end of the active portion of the test cycle results in the RLEN signal going low. The high-to-low RLEN transition propagates through the standard timing circuit 500 causing the STD_DIS and PRECH_ signals to be driven low The low STD_DIS signal turns off transistors N308 and N312, ending the discharge operation and thereby allowing the boot node 308 and charge node 302 to be precharged. When the PRECH_ signal goes low, transistor P304 is turned on. Because the PRECH_EN signal is already high, transistors N314 and N316 are already on, and the boot node 308 and charge node 302 are precharged.

The end of the active test cycle also results in the SAEN signal going low. This causes the TST_DIS_ signal to go high, turning on transistor N324 and turning off transistor N312. Because transistor P300 is already turned on, the turning of transistor N324 also precharges the charge node 302.

At time t6, the RLEN signal transition passes through the precharge delay circuit 506 causing the PRECH_EN and PUMP_ signals to go low and the BOOT_EN_ signal to go high. When the PRECH_EN signal goes low, transistors N314 and N316 are turned off, isolating the boot node 508 and the charge node 502 from the precharge supply node 318. The low PUMP_signal level driyes the output of inverter I302 high, initiating the pumping action of the clamp/pump circuit 320. The high BOOT_EN_ signal level causes the boot precharge node 316 to be driven to the VSS level allowing capacitors C300 and C302 to be charged for the subsequent booting action. The high BOOT_EN_ signal turns off transistor P306.

The timing diagram of FIG. 6 sets forth a test cycle. A standard cycle would have a similar response, but the TST_DIS_ signal would remain high. In such a case, the TST0 or TST1_ signals would be inactive. Thus, the boot node 308 would be discharged by the rising edge of the STD_DIS signal, maintaining the boot node 308 at the boot voltage for most of the cycle. This arrangement maintains transistor N318 on, allowing the clamp/pump circuit 320 to clamp the charge node potential 302, preventing it from falling below a predetermined clamp level.

While the various embodiments set forth herein illustrate a word line drive and test circuit for use in a DRAM, it is understood that the teaching set forth in the embodiments can be applied to other semiconductor integrated circuit devices. Further, while particular examples of timing circuits are illustrated, other timing circuits can be employed.

It is also understood that the timing diagrams of FIGS. 2A, 2B and 6 are intended to be illustrative of the general operation of the preferred embodiment, and should not be construed as limiting the invention thereto. For example, the amount of time between the booting operation and the low-going edge of the TST_DIS_ signal can be increased to detect slower current leakage, or decreased for larger current leakage. In addition, such increases could be accompanied by a longer RAS_ cycle.

While the preferred embodiment illustrates an example of a word line that is driven to a positive VPP voltage, the teachings of the preferred embodiment could be applied to word lines that are driven to negative voltages.

Thus, it is understood that while the present invention has been described in terms of detailed preferred embodiments, various changes, substitutions, and alterations could be made without departing from the spirit and scope of the invention. Accordingly, the present invention is intended to be limited only as defined by the appended claims.

What is claimed is:

1. A line leakage testing circuit, comprising:

a first supply node;

a charge node;

a conductive line coupled to the charge node;

a charge circuit having a boot impedance path disposed between the first supply node and the charge node, the boot impedance path being controlled by the potential at a boot node and having a low impedance when the boot node is at an enable potential, and a high impedance when the boot node is at a disable potential; and a boot enable circuit that drives the boot node to the enable potential;

a boot disable circuit that receives a standard disable signal and drives the boot node to the disable potential a first time period after the boot enable circuit drives the boot node to the enable potential, and receives a test disable signal and drives the boot node to the disable potential a second time period after the boot enable circuit drives the boot node to the enable potential, the second time period being shorter than the first time period.

2. The circuit of claim 1, wherein:

the first supply node is coupled to a first supply potential;

the boot node enable potential is greater in magnitude than the first supply potential; and the boot enable circuit drives the boot node to the enable potential in response to the standard disable signal.

3. The circuit of claim 1, further including:

a boot disable circuit includes
    a first disable device having a first disable impedance path disposed between the boot node and the disable potential, the first disable impedance path being controlled by the standard disable signal; and
    a second disable device having a second disable impedance path disposed between the boot node and the disable potential, the second disable impedance path being controlled by the test disable signal.

4. The circuit of claim 1, wherein:

the conductive line is a word line, and the word line is coupled to the charge node by a word line select device, the word line select device including a controllable impedance path disposed between the word line and the charge node.

5. The circuit of claim 4, wherein:

the first supply node is coupled to a high supply potential;

the boot node enable potential is higher than he first supply potential; and the charge circuit includes an n-channel insulated gate field effect transistor (IGFET) having a source-drain path coupled between the first supply node and the charge node.

6. The circuit of claim 1, further including:

a clamping circuit coupled to the charge node, the clamping circuit preventing the charge node from varying from clamping voltage when enabled, the clamping circuit being disabled in response to the test disable signal.

7. The circuit of claim 6, wherein:

the clamping circuit is coupled to the boot node, and is enabled and disabled according to the potential at the boot node.

8. The circuit of claim 1, further including:

a probe pad coupled to the charge node.

9. A test circuit for detecting current leakage on a semiconductor memory device word line, the test circuit comprising:

a standard timing circuit that receives a row logic enable signal, the standard timing circuit including
    a boot enable timing path that activates a boot enable signal in response to the row logic enable signal, and
    a standard boot disable timing path that activates a standard boot disable signal in response to the row logic enable signal, the standard boot disable signal being activated after the boot enable signal is activated;

a test timing circuit that includes a test boot disable timing path that activates a test boot disable signal in response to the row logic enable signal, the test boot disable signal being activated after the boot enable signal is activated, and prior to the standard boot disable signal being activated;

a boot circuit that drives a boot node to a boot potential in response to the activated boot enable signal;

a standard boot disable circuit that drives the boot node to a disable potential in response to the activated standard boot disable signal;

a test boot disable circuit that drives the boot node to the disable potential in response to the activated test boot disable signal; and a charge circuit coupled between at least one word line and a supply potential, the charge circuit coupling the at least one word line to the supply potential when the boot node is at the boot potential, the charge circuit isolating the at least one word line from the supply potential when the boot node is at the disable potential.

10. The test circuit of claim 9, wherein:

the row logic enable signal includes an initial edge and a terminal edge; and the boot enable timing path activates the boot enable signal in response to the initial edge of the row logic enable signal, and the standard boot disable timing path includes a first delay circuit that delays the standard boot disable signal with respect to the initial edge of the row logic enable signal.

11. The test circuit of claim 9, wherein:

the active cycle enable signal includes an initial edge and a terminal edge; and the test boot disable timing path includes a second delay circuit that delays the test boot disable signal with respect to the initial edge of the row logic enable signal.

12. The test circuit of claim 9, wherein:

the boot circuit includes
    a boot capacitor having a first plate coupled to the boot node and a second plate coupled to a boot drive node,
    a boot predrive transistor having a source-drain path coupled between the boot drive node and a predrive potential, and a gate coupled to the boot enable signal, and
    a boot drive transistor having a source-drain path coupled between the boot drive node and a drive potential, and a gate coupled to the boot enable signal.

13. The test circuit of claim 12, further including:

the boot enable timing path further activating a precharge signal in response to the row logic enable signal, the precharge signal being activated prior to the boot enable signal being activated; and a precharge circuit that drives the boot node to a precharge potential in response to an active precharge signal.

14. The test circuit of claim 13, wherein:

the precharge circuit includes a precharge transistor coupled having a source-drain path disposed between the boot node and the precharge voltage, and a gate that receives the precharge signal.

15. The test circuit of claim 9, further including:

the charge circuit includes
    a charge device that couples the supply potential to a charge node according to the potential at the boost node, and
    a select circuit that couples the charge node to the at least one word lines in response to a decoded signal.

16. The test circuit of claim 15, wherein:

the charge device includes an n-channel IGFET having a source-drain path disposed between the supply potential and the charge node, and the select circuit includes an n-channel IGFET having a source-drain path disposed between the charge node and the at least one word line.

17. In a semiconductor memory device having a power supply voltage, a method of activating word lines, comprising the steps of:

in a standard cycle,
coupling a word line to a charge node,
coupling the charge node to a charge voltage by the source-drain path of a charge insulated gate field effect transistor (IGFET),
driving the gate of the charge IGFET by a boot voltage that is greater than the power supply voltage to couple the word line to the charge node,
maintaining the gate of the charge IGFET at the boot voltage for a predetermined standard cycle period; and in a test cycle,
coupling a word line to a charge node,
coupling the charge node to a charge voltage by the source-drain path of a charge insulated gate field effect transistor (IGFET),
driving the gate of the charge IGFET by the boot voltage to couple the word line to the charge node, and
driving the gate of the charge IGFET to a disable voltage to isolate the word line from the charge voltage.

18. The method of claim 17, wherein:
the step of coupling the word line to the charge node includes activating a word line driver transistor with a decoded word line select signal.

19. The method of claim 17, wherein:
the semiconductor memory device includes at least one sense amplifier that is enabled by a sense amplifier enable signal; and
in the test cycle
the step of driving the gate of the charge IGFET by a boot voltage includes driving the gate of the charge IGFET in response to a row address timing signal, and
the step of driving the gate of the charge IGFET to a disable voltage includes driving the gate of the charge IGFET in response to the sense amplifier enable signal.

20. The method of claim 17, wherein:
the standard cycle further includes,
clamping a clamp node to a clamp voltage to prevent the clamp node from falling below the magnitude of the clamp voltage, and
coupling the clamp node to the charge node; and
the test cycle further includes isolating the clamp node from the charge node.

21. The method of claim 17, wherein:
the step of driving the gate of the charge IGFET by a boot voltage includes
coupling the gate of the charge IGFET to a predrive voltage, and
using a charge pump to boost the voltage at the gate of the charge IGFET to the boot voltage, the boot voltage being greater than the power supply voltage; and
the step of driving the gate of the charge IGFET to a disable voltage includes coupling the gate of the charge IGFET to a low power supply voltage.

22. The method of claim 17, wherein:
the test cycle further includes probing the word line to determine if current is leaking from the word line.

* * * * *